US012598714B2

(12) United States Patent
Li et al.

(10) Patent No.: US 12,598,714 B2
(45) Date of Patent: Apr. 7, 2026

(54) LOCKING STRUCTURE AND ELECTRONIC DEVICE

(71) Applicants: HON HAI PRECISION INDUSTRY CO., LTD., New Taipei (TW); HONGFUJIN PRECISION INDUSTRY (WUHAN) CO., LTD., Wuhan (CN)

(72) Inventors: Jia-Fu Li, Wuhan (CN); Jun-Zhi Xu, Wuhan (CN); Da-Long Sun, Shenzhen (CN)

(73) Assignees: HON HAI PRECISION INDUSTRY CO., LTD., New Taipei (TW); HONGFUJIN PRECISION INDUSTRY (WUHAN) CO., LTD., Wuhan (CN)

( * ) Notice: Subject to any disclaimer, the term of this patent is extended or adjusted under 35 U.S.C. 154(b) by 109 days.

(21) Appl. No.: 18/770,709

(22) Filed: Jul. 12, 2024

(65) Prior Publication Data

US 2025/0203790 A1    Jun. 19, 2025

(30) Foreign Application Priority Data

Dec. 13, 2023    (CN) .......................... 202323406651.4

(51) Int. Cl.
*H05K 5/02* (2006.01)

(52) U.S. Cl.
CPC .................................. *H05K 5/0221* (2013.01)

(58) Field of Classification Search
CPC .................................................... H05K 5/0221
See application file for complete search history.

(56) References Cited

U.S. PATENT DOCUMENTS

| | | | |
|---|---|---|---|
| 2013/0113347 A1* | 5/2013 | Mao ..................... | H05K 5/0221 292/57 |
| 2018/0238083 A1* | 8/2018 | Allirot ................ | E05B 73/0082 |
| 2022/0078933 A1* | 3/2022 | Shinde .................... | H02B 1/42 |

* cited by examiner

*Primary Examiner* — Robin J Mishler
(74) *Attorney, Agent, or Firm* — ScienBiziP, P.C.

(57) ABSTRACT

A locking structure is provided, the locking structure includes a locking panel, a first connecting element, a second connecting element, a latch component, and a locking component. The first connecting element spaced from the second connecting element defines a stop groove, the first connecting element and the second connecting element are elastically connected to the locking panel. The latch component arranged between the first connecting element and the second connecting element includes a first latch board defining a first hole. The locking component includes a lock body and a lock tongue, the lock tongue is rotatably connected to the lock body, the lock body is configured to rotate the lock tongue in the first hole, the lock tongue moves the latch component close to the first connecting element, the latch portion is moveably received in the stop groove. An electronic device is also provided.

20 Claims, 7 Drawing Sheets

<u>100</u>

LOCKING STRUCTURE AND ELECTRONIC DEVICE

FIELD

The present disclosure relates to fields of electronic device technology, particularly to a locking structure and an electronic device.

BACKGROUND

In prior art, more and more electronic devices appear on the market with continuous development of computer technology. For example, phones and computers have appeared in people's daily life, users have put forward higher and higher requirements for functions and appearance of the electronic devices.

In existing electronic devices, a sideboard is usually fixed on the electronic device by a detachable way, and anyone can remove the sideboard from the electronic devices to check internal components of the electronic device. Therefore, safety of the electronic devices can be not guaranteed.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

In order to make the above-mentioned objects, features and advantages of the present application more obvious, a detailed description of specific embodiments of the present application will be described in detail with reference to the accompanying drawings. A number of details are set forth in the following description so as to fully understand the present application. However, the present application can be implemented in many other ways different from those described herein, and those skilled in the art can make similar improvements without violating the contents of the present application. Therefore, the present application is not to be considered as limiting the scope of one embodiment described herein.

Several definitions that apply throughout this disclosure will now be presented.

The term "coupled" is defined as coupled, whether directly or indirectly through intervening components, and is not necessarily limited to physical connections. The connection may be such that the objects are permanently coupled or releasably coupled. The term "substantially" is defined to be essentially conforming to the particular dimension, shape, or other feature that the term modifies, such that the component need not have that exact feature. The term "comprising," when utilized, means "including, but not necessarily limited to"; it specifically indicates open-ended inclusion or membership in the so-described combination, group, series, and the like.

Unless otherwise defined, all technical and scientific terms used herein have the same meaning as commonly understood by one skilled in the art. The terms used in a specification of the present application herein are only for describing specific embodiments and are not intended to limit the present application. The terms "and/or" used herein comprises any and all combinations of one or more of associated listed items.

Some embodiments of the present application are described in detail. In the case of no conflict, the following embodiments and the features in one embodiment can be combined with each other.

Referring to FIG. 1, FIG. 2, FIG. 3, FIG. 4, FIG. 5, and FIG. 6, the present application discloses a locking structure 100. The locking structure 100 is mainly installed on electronic devices. For example, the locking structure 100 can be installed on a sideboard or a top board of the electronic devices. The locking structure 100 can protect internal structure of the electronic devices and improve safety of the electronic devices. The electronic devices can be phones, intelligent learning machines, tablets, computers, and so on.

Figure 1:
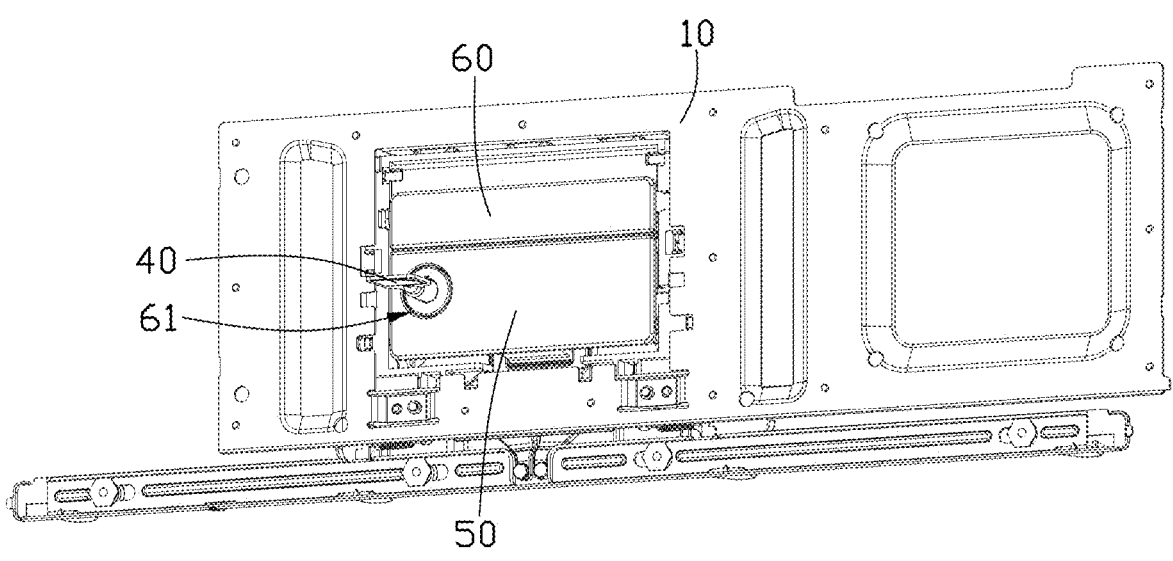
FIG. 1 illustrates a schematic view of a locking structure in an embodiment of the present disclosure.
Figure 2:
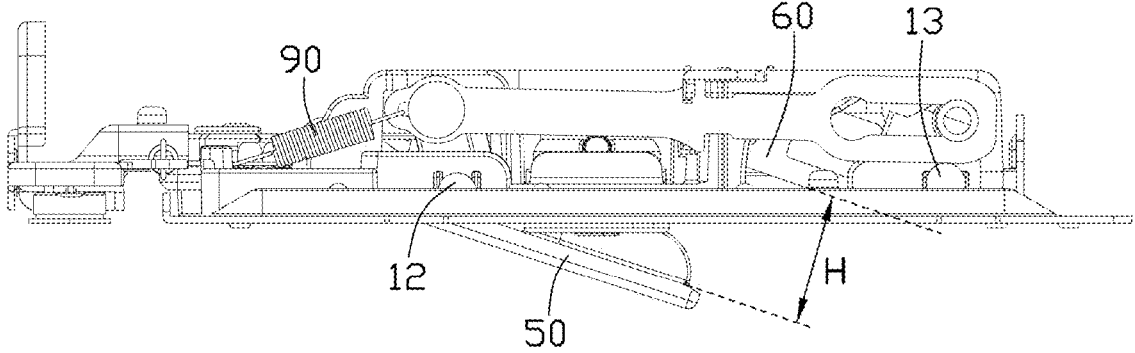
FIG. 2 illustrates a sate diagram of a second handle in an opening state shown in FIG. 1.
Figure 3:
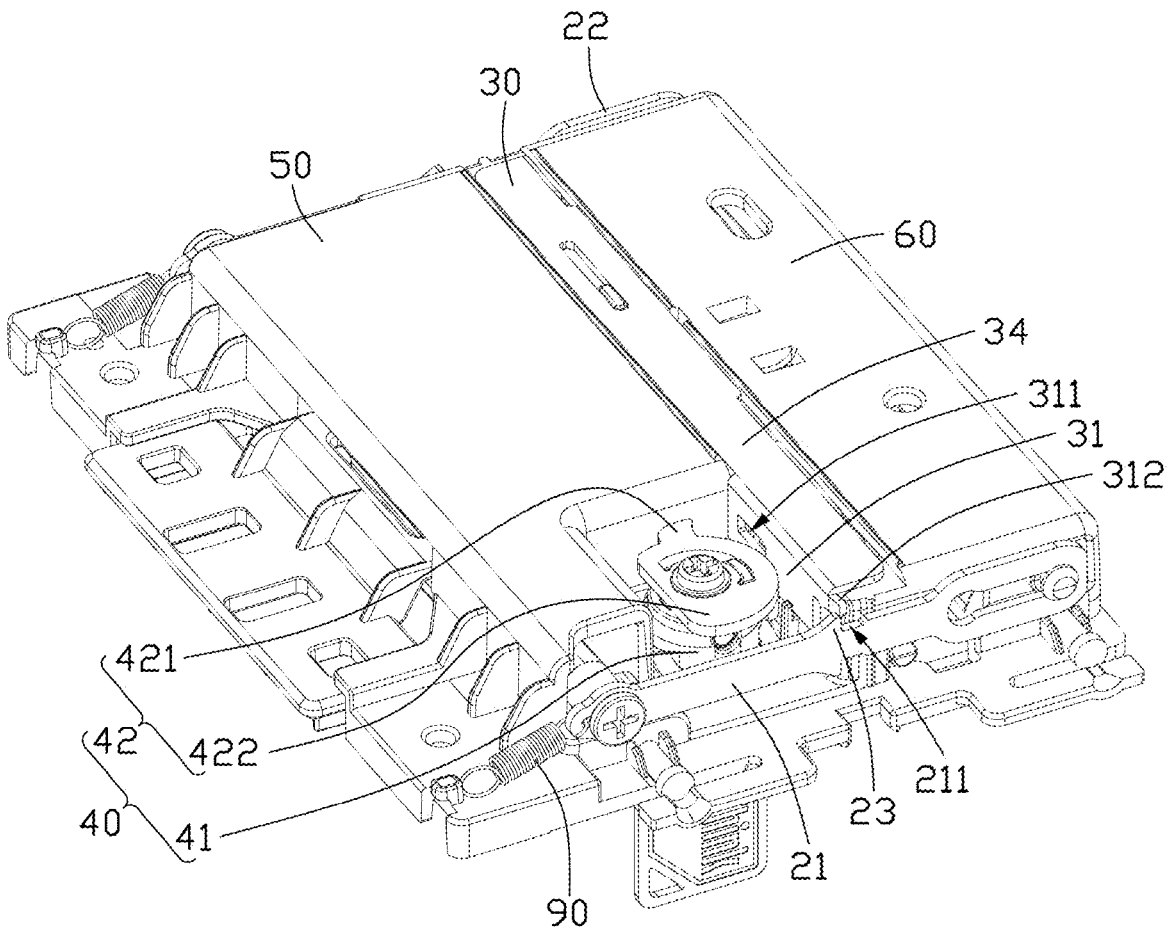
FIG. 3 illustrates a structure diagram of a part of the locking structure in an unlocked state shown in FIG. 1.

Referring to FIG. 1, FIG. 2, and FIG. 3, in one embodiment, the locking structure 100 includes a locking panel 10, a first link element 21, a second link element 22, a latch component 30 and a locking component 40. The first link element 21 defines a stop groove 211. The second link element 22 is spaced apart from the first link element 21, the first link element 21 and the second link element 22 are elastically connected to the locking panel 10. The latch component 30 is arranged between the first link element 21 and the second link element 22, one end of the latch component 30 crosses the first link element 21, another end of the latch component 30 crosses the second link element 22. The latch component 30 includes a first latch board 31, the first latch board 31 is movably connected to the locking panel 10, the first latch board 31 defines a first hole 311, one end of the first latch board 31 close to the first hole 311 provides with a raised latch portion 312. The locking component 40 is arranged between the first link element 21 and the second link element 22, the locking component 40 is drivingly connected to the first latch board 31. The locking component 40 includes a lock body 41 and a lock tongue 42, the lock tongue 42 is rotatably connected to the lock body 41, the lock body 41 is configured to rotate the lock tongue 42 in the first hole 311, the lock tongue 42 moves the latch component 30 close to the first link element 21, the latch portion 312 is moveably received in the stop groove 211.

Figure 7:
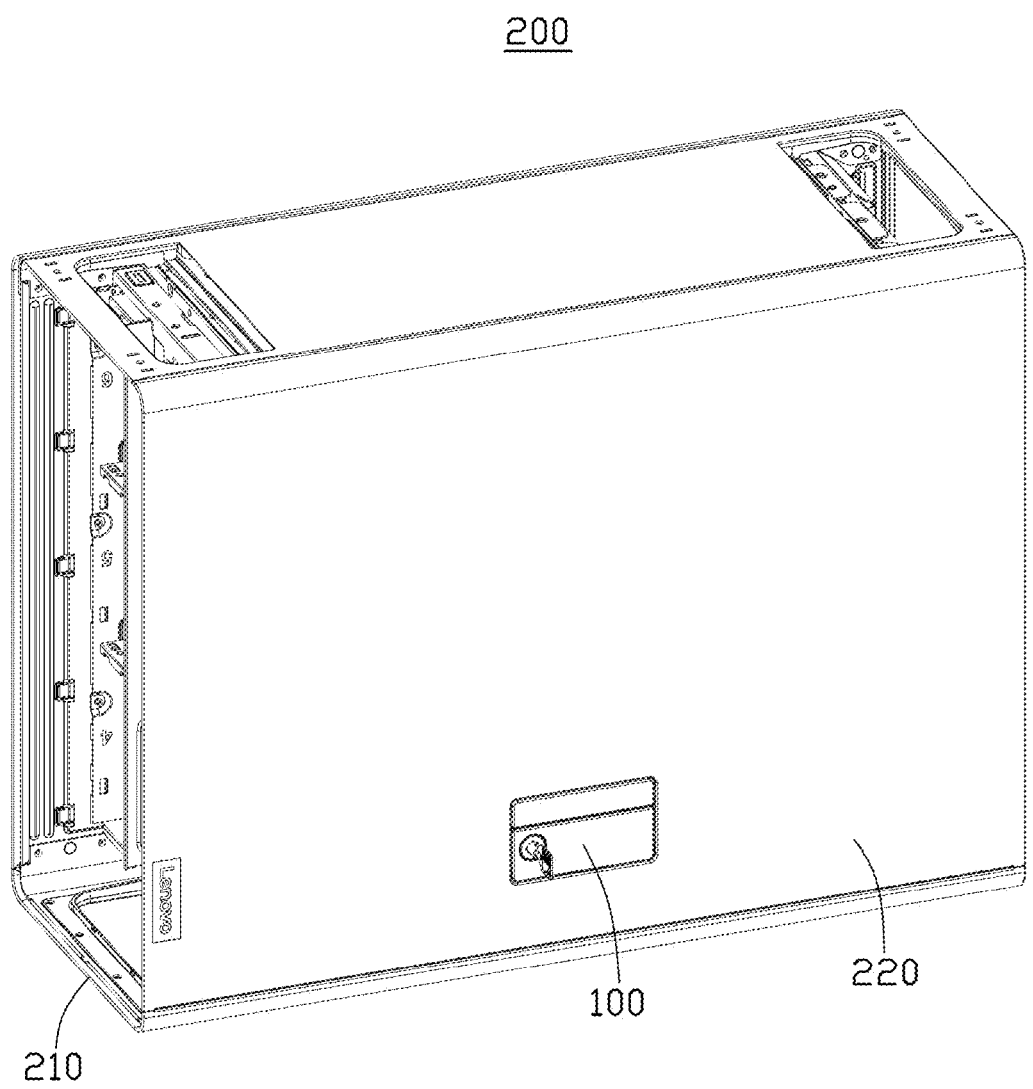
FIG. 7 illustrates a diagram of an electronic device in an embodiment of the present disclosure.

In one embodiment, referring to FIG. 7, the locking panel 10 is fixedly connected to a sideboard 220 of the electronic device 200, and the locking structure 100 is fixed on the electronic device 200 to ensure the safety of the internal structure of the electronic device 200. For example, the locking panel 10 is arranged on the electronic device 200 using threaded nuts or welding techniques. In other embodiment, the locking panel 10 may be arranged on the electronic device 200 by other ways.

The first link element 21 and the second link element 22 are arranged on a side of the locking panel 10. The latch component 30 is arranged between the first link element 21 and the second link element 22. When the latch component 30 is moved close to the first link element 21, one end of the latch component 30 abuts against the first link element 21. The lock tongue 42 is partly received in the first hole 311. When a user inserts a key into the lock body 41 and turns the key to drive the lock tongue 42 rotate in the first hole 311, a rotation of the lock tongue 42 drives the latch component 30 to move close to the first link element 21. Finally, the latch portion 312 arranged at one end of the latch component 30 is moveably received in the stop groove 211, the latch component 30 abuts against the first link element 21 to lock the locking structure 100. Conversely, when the user inserts the key into the lock body 41, the lock tongue 42 drives the latch component 30 to move father away from the first link element 21, the latch component 30 is separated from the first link element 21 to unlock the locking structure 100. The safety of the internal structure of the electronic device is guaranteed by the locking structure 100.

In one embodiment, the locking structure 100 further includes a first handle 50 and a second handle 60. One end of the first handle 50 and one end of the second handle 60 are rotatably connected to the locking panel 10. The first handle 50 is disposed opposite to the second handle 60, the first handle 50 and the second handle 60 cover the latch component 30 and the locking component 40. The first handle 50 is rotatably connected to one end of the first link element 21 and one end of the second link element 22, the second handle 60 is rotatably connected to another end of the first link element 21 and another end of the second link element 22.

In one embodiment, referring to FIG. 1, FIG. 2, and FIG. 3, the second handle 60 defines a containing hole 61, the locking component 40 is partly received in the containing hole 61, the key can be inserted into the locking component 40 and extends through the containing hole 61. One end of the first handle 50 is fixed connected to the first link element 21, another end of the first handle 50 is fixed connected to the second link element 22. One end of the second handle 60 is fixedly connected to the first link element 21, another end of the second handle 60 is fixed connected to the second link element 22.

Figure 5:
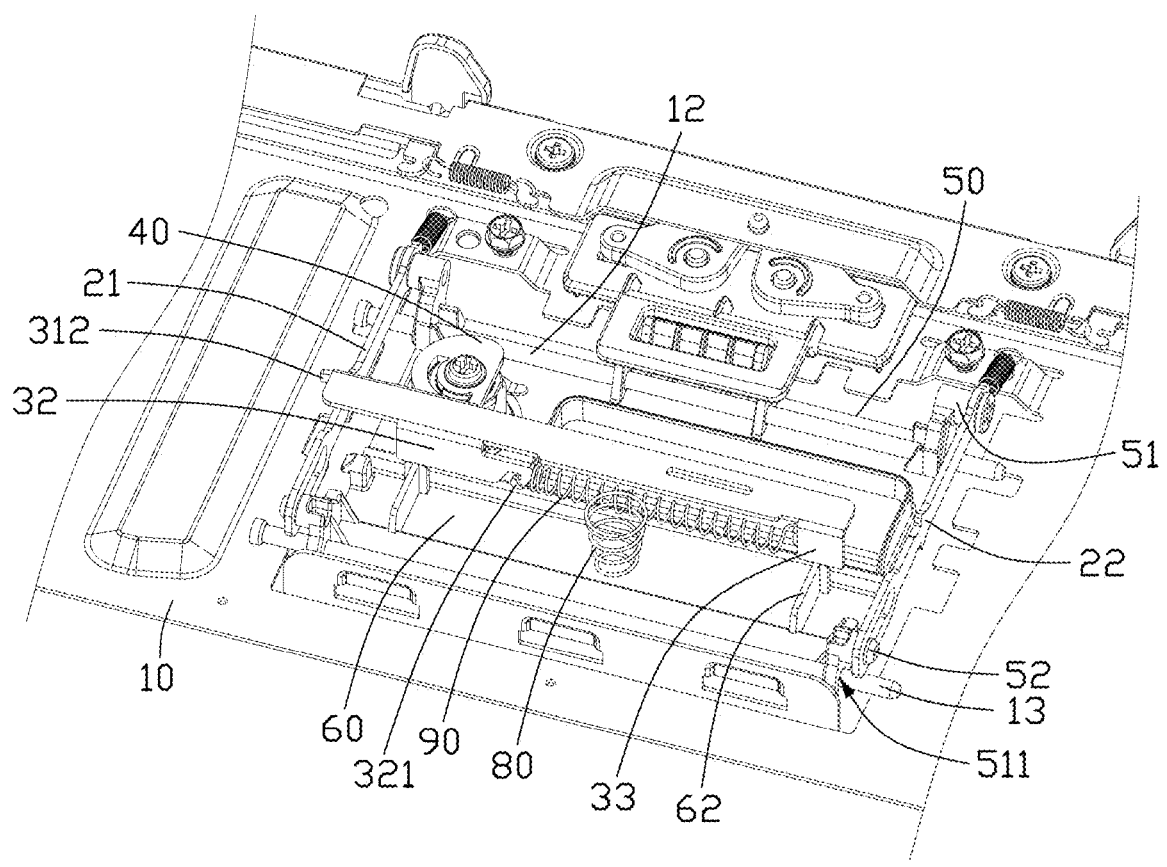
FIG. 5 illustrates a structure diagram of an internal structure the locking structure shown in FIG. 1.

In one embodiment, referring to FIG. 2, FIG. 5, and FIG. 7, a second elastic element 80 is provided between the locking panel 10 and the second handle 60. When the user presses the second handle 60, the second elastic element 80 is compressed, and when the pressure applied on the second handle 60 is disappear, the second handle 60 can be rotated by the second elastic element 80 and moved farther away from the locking panel 10. The second handle 60 drives one end of the first link element 21 and one end of the second link element 22 move farther away from the locking panel 10, another end of the first link element 21 and another end of the second link element 22 move close to the locking panel 10. A latch space H is formed among the first handle 50, the second handle 60, and the locking panel 10. After the user inserts the key into the locking component 40 to unlock the locking structure 100, the user can put the hand in the latch space H to remove the sideboard 220 from the electronic device 200. The first handle 50 and the second handle 60 are rotatably connected to the first link element 21 and the second link element 22, when the user's hand leaves the latch space H, the second handle 60 can be reversely rotated, the first handle 50 and the second handle 60 will be in a same plane, and the latch space H will disappear to keep the surface of the electronic device 200 smooth and beautiful.

In one embodiment, the second elastic element 80 is a pressure spring. When the second handle 60 is pressed by external force, the pressure spring is also deformed by the external force, a side of the second handle 60 connecting the first link element 21 and the second link element 22 moves close to the locking panel 10.

The locking component 40 is arranged on a side of the first link element 21 close to the second link element 22. When the user inserts the key into the lock tongue 42 and turns the key to drive the lock tongue 42 and the latch component 30, the latch component 30 moves close to the first link element 21. The stop groove 211 is defined on the first link element 21, and the latch portion 312 is moveably received in the stop groove 211. The first link element 21 abuts against the latch component 30, the locking structure 100 is locked. When the user turns the key in a reverse direction, the lock tongue 42 has a callback feature, the locking component 40 is rotated in the reverse direction, the latch component 30 moves close to the second link element 22, the latch portion 312 is separated from the stop groove 211, and the locking structure 100 is unlocked.

Figure 4:
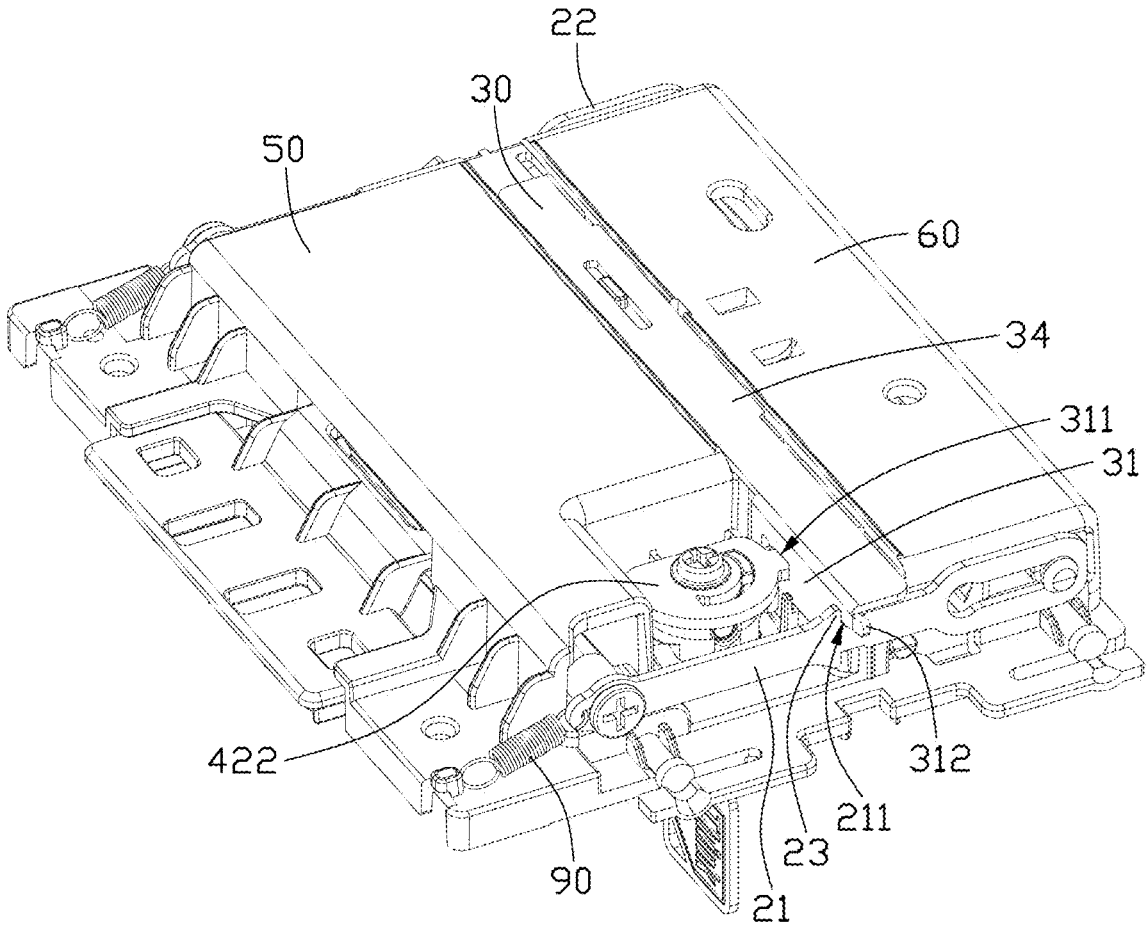
FIG. 4 illustrates a structure diagram of a part of the locking structure in a locked state shown in FIG. 1.

Please referring to FIG. 4 and FIG. 5, the latch component 30 also includes a latch base 34 and a second latch board 32. One end of the latch base 34 is connected to the first latch board 31, another end of the latch base 34 is connected to the second latch board 32, the second latch board 32 is arranged at a side of the second handle 60, one end of the second latch board 32 is elastically connected to the locking panel 10. One side of the second handle 60 close to the locking panel 10 provides with a plurality of stop portions 62, the plurality of stop portions 62 is protruded close to the locking panel 10. When the lock tongue 42 drives the latch component 30 close to the first link element 21, the second latch board 32 abuts against the plurality of stop portions 62. When the user rotates the latch tongue 42, and part of the latch tongue 42 is received in the first hole 311, the latch tongue 42 drives the latch component 30 close to the first link element 21, the second latch board 32 also moves close to the first link element 21. The second latch board 32 abuts against the plurality of stop portions 62, when the second handle 60 is pressed by the external force, the second handle 60 does not rotate with respect to the first link element 21 and the second link element 22 to ensure another locking of the locking structure 100. On the contrary, when the user turns the latch tongue 42 in the reverse direction, the latch component 30 moves farther away from the first link element 21, the second latch board 32 is separated from the stop portion 62. When the second handle 60 is pressed by the external force, the second handle 60 rotates relative to the first link element 21 and the second link element 22 by the second elastic element 80. The latch space His formed between the first handle 50, the second handle 60 and the locking panel 10.

In one embodiment, the latch component 30 also includes a third latch board 33, the third latch board 33 is connected to the latch base 34. The second latch board 32 and the third latch board 33 are arranged at a side of the latch base 34, the second latch board 32 and the third latch board 33 are spaced apart from each other. when the lock tongue 42 moves the latch component 30 closes to the first link element 21, the third latch board 33 abuts against the stop portion 62. In the embodiment, the second latch board 32 and the third latch board 33 are arranged at an end of the latch base 34 opposite the locking component 40, the first latch board 31 is arranged at an end of the latch base 34 close to the locking component 40. When the user inserts the key into the locking component 40 and rotates the locking component 40, the latch tongue 42 can be partially received in the first hole 311.

Figure 6:
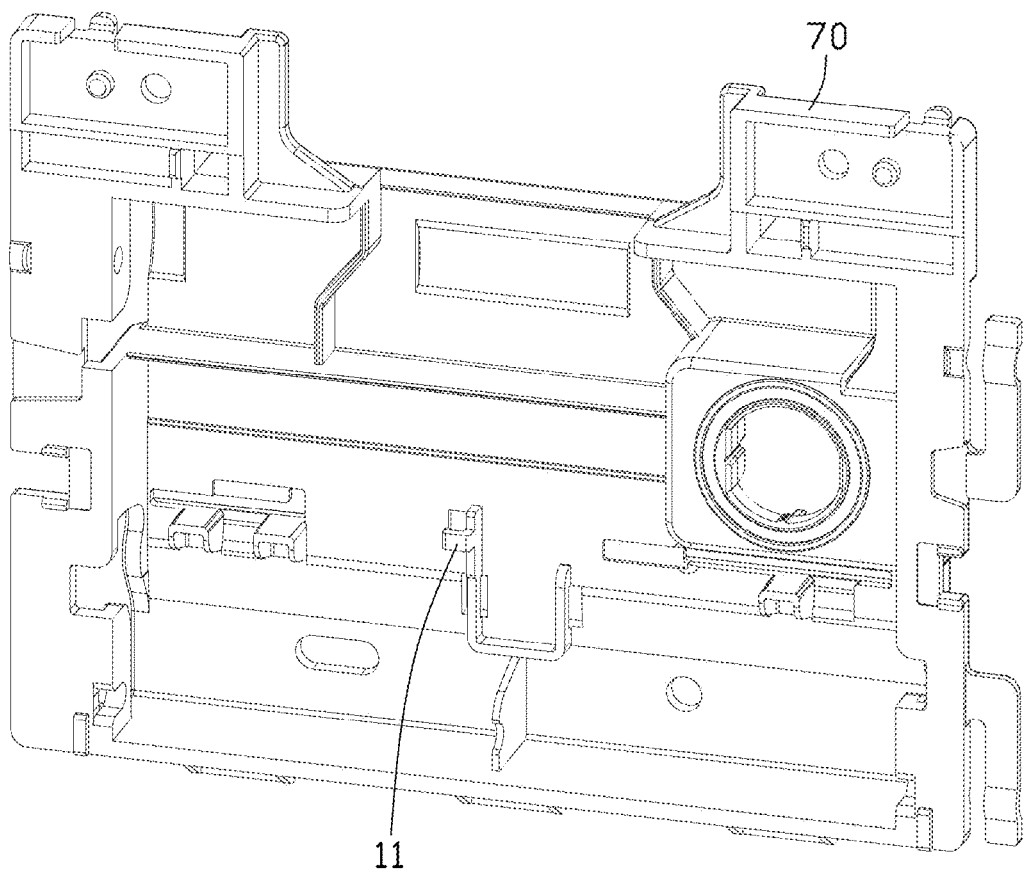
FIG. 6 illustrates a schematic view of a cover board shown in FIG. 1.

Referring to FIG. 5 and FIG. 6, the locking structure 100 further includes a first elastic element 90 and a cover board 70. The cover board 70 is arranged opposite to the locking panel 10, the latch component 30 and the locking component 40 are arranged between the cover board 70 and the locking panel 10. The end of the second latch board 32 provides with a first hook 321, a side of the cover board 70 close to the locking panel 10 provides with a second hook 11, one end of the first elastic element 90 is connected to the first hook 321, another end of the first elastic element 90 is connected to the second hook 11. The first elastic element 90 is a pullback spring.

When the user rotates the locking component 40, the locking component 40 moves the latch component 30 close to the first link element 21, the second latch board 32 moves close to the first link element 21, the first elastic element 90 is stretched. When the user rotates the locking component 40 in the reversion direction, elastic recovery force of the first elastic element 90 drives the latch component 30 away from the first link element 21.

In one embodiment, please referring to FIG. 3 and FIG. 5, one end of the first link element 21 is connected to the first elastic element 90, another end of the first link element 21 is connected to the second handle 60. In one embodiment, one end of the first link element 21 is connected to the locking panel 10 via the first elastic element 90, another end of the first link element 21 is connected to one end of the second handle 60. One end of the second link element 22 is connected to the locking panel 10 via the first elastic element 90, another end of the second link element 22 is connected to another end of the second handle 60.

In one embodiment, the locking structure 100 also includes first rotating shaft 12 and a second rotating shaft 13. The first rotating shaft 12 is space apart from the second rotating shaft 13, the first handle 50 provides with a first connector 51, the second handle 60 provides with a second connector 52. The first connector 51 defines with a connecting hole 511, and the second connector 52 defines a connecting hole 511, the first rotating shaft 12 extends through the connecting hole 511 and is rotatably connected to the first connector 51, the second rotating shaft 13 extends through the connecting hole 511 and is rotatably connected to the second connector 52.

In one embodiment, the first handle 50 provides with the two first connector 51, the two first connector 51 are spaced apart from each other, the two first connector 51 are arranged at one side of the first handle 50. The first rotating shaft 12 is rotatably connected to the first handle 50, and the first rotating shaft 12 extends through one connecting hole 511 of the one first connector 51 and another connecting hole 511 of another first connector 51. The one first connector 51 away from the first handle 50 is connected to the first link element 21, another first connector 51 away from the first handle 50 is connected to the second link element 22. The second handle 60 provides with the two second connectors 52, the two second connectors 52 are spaced apart from each other, and the two second connectors 52 are arranged at one side of the second handle 60. The second rotating shaft 13 is rotatably connected to the second handle 60, and the second rotating shaft 13 extends through one connecting hole 511 of the one second connector 52 and another connecting hole 511 of another second connector 52. The one second connector 52 away from the second handle 60 is connected to the first link element 21, the another second connecting element 52 away from the second handle 60 is connected to the second link element 22.

In one embodiment, the first link element 21 includes a raised block 23, the raised block 23 is arranged at a side of the stop groove 211, when the latch tongue 42 moves the latch component 30 close to the first link element 21, the raised block 23 abuts against the first latch board 31. The raised block 23 extends close to the locking panel 10. When the latch portion 312 is moveably received in the stop groove 211, the raised block 23 abuts against the latch base 34 to secure the latch component 30 and the first link element 21.

In one embodiment, the lock tongue 42 provides with a locking portion 421 and a rotating portion 422. The rotating portion 422 is rotatably connected to the lock body 41, the locking portion 421 extends inclinedly from an outer edge of the rotating portion 422 to the latch component 30. When the rotating portion 422 is rotated, the locking portion 421 can be received in the first hole 311.

Referring to FIG. 7, the present application also discloses an electronic device 200. The electronic device 200 includes a device base 210, a sideboard 220 and the locking structure 100. The sideboard 220 is connected to the device base 210, the locking structure 100 is fixedly connected to the sideboard 220.

In the locking structure 100, on the one hand, the second handle is pressed by the external force, the second handle 60 moves close to the locking panel 10, the first handle 50 moves away from the locking panel 10. The latch space H is formed among the first handle 50, the second handle 60 and the locking panel 10, and the user can put the hand into the latch space H to operate the first handle 50. On the other hand, the user inserts the key into the locking component 40 and turns the lock tongue 42, the latch component 30 moves close to the first link element 21, the first link element 21 abuts against the first latch board 31 to lock the locking structure 100. Furthermore, the stop portion 62 abuts against the second latch board 32 and the third latch board 33, the second handle 60 cannot be turned when the second handle 60 is pressed externally by the external force. The safety of internal components of the electronic device 200 is protected by the locking structure 100.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A locking structure comprising:
   a locking panel;
   a first link element defining a stop groove;
   a second link element spaced from the first link element, wherein the first link element and the second link element are elastically connected to the locking panel;
   a latch component arranged between the first link element and the second link element, wherein one end of the latch component crosses the first link element, another end of the latch component crosses the second link element, the latch component comprises a first latch board, the first latch board is movably connected to the locking panel, the first latch board defines a first hole, one end of the first latch board close to the first hole provides with a raised latch portion; and
   a locking component arranged between the first link element and the second link element, wherein the locking component is drivingly connected to the first latch board, the locking component comprises a lock body and a lock tongue, the lock tongue is rotatably connected to the lock body, the lock body is configured to rotate the lock tongue in the first hole, the lock tongue moves the latch component close to the first link element, the latch portion is moveably received in the stop groove.

2. The locking structure as claimed in claim 1, wherein the locking structure further comprises a first handle and a second handle, the first handle is disposed opposite to the second handle, the first handle and the second handle cover the latch component and the locking component, the first handle is rotatably connected to one end of the first link element and one end of the second link element, the second handle is rotatably connected to another end of the first link element and another end of the second link element.

3. The locking structure as claimed in claim 2, wherein one side of the second handle close to the locking panel provides with a plurality of stop portions, the plurality of stop portions is protruded close to the locking panel, the latch component further comprises a latch base and a second latch board, a side of the latch base is connected to the first latch board, another side of the latch base is connected to the second latch board, the second latch board is arranged at a side of the second handle, an end of the second latch board is elastically connected to the locking panel, when the lock tongue moves the latch component closes to the first link element, the second latch board abuts against the plurality of stop portions.

4. The locking structure as claimed in claim 3, wherein the latch component further comprises a third latch board, the third latch board is connected to the latch base, the second latch board and the third latch board are arranged at the side of the latch base, the second latch board and the third latch board are spaced apart from each other, when the lock tongue moves the latch component closes to the first link element, the third latch board abuts against the stop portion.

5. The locking structure as claimed in claim 3, wherein the locking structure further comprises a first elastic element and a cover board, the cover board is arranged opposite to the locking panel, the latch component and the locking component are arranged between the cover board and the locking panel, the end of the second latch board provides with a first hook, a side of the cover board close to the locking panel provides with a second hook, one end of the first elastic element is connected to the first hook, another end of the first elastic element is connected to the second hook.

6. The locking structure as claimed in claim 5, wherein one end of the first link element is connected to the first elastic element, another end of the first link element is connected to the second handle.

7. The locking structure as claimed in claim 2, wherein the locking structure further comprises a first rotating shaft and a second rotating shaft, wherein the first rotating shaft is space from the second rotating shaft, the first handle provides with a first connector, the second handle provides with a second connector, the first connector and the second connector define a connecting hole, the first rotating shaft extends through the connecting hole and is rotatably connected to the first connector, the second rotating shaft extends through the connecting hole and is rotatably connected to the second connector.

8. The locking structure as claimed in claim 1, wherein the first link element comprises a raised block, the raised block is arranged a side of the stop groove, the raised block abuts against the first latch board.

9. The locking structure as claimed in claim 1, wherein the lock tongue provides with a locking portion and a rotating portion, the rotating portion is rotatably connected to the lock body, the locking portion extends inclinedly from an outer edge of the rotating portion to the latch component.

10. The locking structure as claimed in claim 2, wherein the second handle defines a containing hole, the locking component is partly received in the containing hole.

11. An electronic device comprising:
a device base;
a sideboard fixedly connecting to the device base;
a locking panel fixedly connecting to a side of the sideboard away from the device base;
a first link element defining a stop groove;
a second link element spaced from the first link element, wherein the first link element and the second link element are elastically connected to the locking panel;
a latch component arranged between the first link element and the second link element, wherein one end of the latch component crosses the first link element, another end of the latch component crosses the second link element, the latch component comprises a first latch board, the first latch board is movably connected to the locking panel, the first latch board defines a first hole, one end of the first latch board close to the first hole provides with a raised latch portion; and
a locking component arranged between the first link element and the second link element, wherein the locking component is drivingly connected to the first latch board, the locking component comprises a lock body and a lock tongue, the lock tongue is rotatably connected to the lock body, the lock body is configured to rotate the lock tongue in the first hole, the lock tongue drives the latch component to move in a direction close to the first link element, the first link element defines a stop groove, the latch portion is moveably contained in the stop groove.

12. The electronic device as claimed in claim 11, wherein the locking structure further comprises a first handle and a second handle, the first handle is disposed opposite to the second handle, the first handle and the second handle cover the latch component and the locking component, the first handle is rotatably connected to one end of the first link element and one end of the second link element, the second handle is rotatably connected to another end of the first link element and another end of the second link element.

13. The electronic device as claimed in claim 12, wherein one side of the second handle close to the locking panel provides with a plurality of stop portions, the plurality of stop portions is protruded close to the locking panel, the latch component further comprises a latch base and a second latch board, a side of the latch base is connected to the first latch board, another side of the latch base is connected to the second latch board, the second latch board is arranged at a side of the second handle, an end of the second latch board is elastically connected to the locking panel, when the lock tongue moves the latch component close to the first link element, the second latch board abuts against the plurality of stop portions.

14. The electronic device as claimed in claim 13, wherein the latch component further comprises a third latch board, the third latch board is connected to the latch base, the second latch board and the third latch board are arranged at the side of the latch base, the second latch board and the third latch board are spaced apart from each other, when the lock tongue moves the latch component closes to the first link element, the third latch board abuts against the stop portion.

15. The electronic device as claimed in claim 13, wherein the locking structure further comprises a first elastic element and a cover board, the cover board is arranged opposite to the locking panel, the latch component and the locking component are arranged between the cover board and the locking panel, the end of the second latch board provides with a first hook, a side of the cover board close to the locking panel provides with a second hook, one end of the first elastic element is connected to the first hook, another end of the first elastic element is connected to the second hook.

16. The electronic device as claimed in claim 15, wherein one end of the first link element is connected to the first elastic element, another end of the first link element is connected to the second handle.

17. The electronic device as claimed in claim 12, wherein the locking structure further comprises a first rotating shaft and a second rotating shaft, wherein the first rotating shaft is space from the second rotating shaft, the first handle provides with a first connector, the second handle provides with a second connector, the first connector and the second connector define a connecting hole, the first rotating shaft extends through the connecting hole and is rotatably connected to the first connector, the second rotating shaft extends through the connecting hole and is rotatably connected to the second connector.

18. The electronic device as claimed in claim 11, wherein the first link element comprises a raised block, the raised block is arranged a side of the stop groove, the raised block abuts against the first latch board.

19. The electronic device as claimed in claim 11, wherein the lock tongue provides with a locking portion and a rotating portion, the rotating portion is rotatably connected to the lock body, the locking portion extends inclinedly from an outer edge of the rotating portion to the latch component.

20. The electronic device as claimed in claim 12, wherein the second handle defines a containing hole, the locking component is partly received in the containing hole.

* * * * *